United States Patent [19]
Aritome et al.

[11] Patent Number: 5,528,547
[45] Date of Patent: * Jun. 18, 1996

[54] ELECTRICALLY ERASABLE PROGRAMMABLE READ-ONLY MEMORY WITH ELECTRIC FIELD DECREASING CONTROLLER

[75] Inventors: Seiichi Aritome; Riichiro Shirota, both of Kawasaki; Ryouhei Kirisawa, Yokohama; Yoshihisa Iwata, Yokohama; Masaki Momodomi, Yokohama, all of Japan

[73] Assignee: Kabushiki Kaisha Toshiba, Kawasaki, Japan

[*] Notice: The portion of the term of this patent subsequent to Apr. 11, 2011, has been disclaimed.

[21] Appl. No.: 332,391

[22] Filed: Oct. 31, 1994

Related U.S. Application Data

[63] Continuation of Ser. No. 201,036, Feb. 24, 1994, Pat. No. 5,402,373, which is a continuation of Ser. No. 683,733, Apr. 11, 1991, Pat. No. 5,293,337.

[30] Foreign Application Priority Data

Apr. 12, 1990 [JP] Japan .................................. 2-095049

[51] Int. Cl.⁶ .............................. G11C 7/00; G11C 11/34
[52] U.S. Cl. ...................... 365/218; 365/182; 365/185.05
[58] Field of Search .................................. 365/185, 218, 365/185.05, 182; 257/316

[56] References Cited

U.S. PATENT DOCUMENTS

| | | |
|---|---|---|
| 4,437,174 | 3/1984 | Masuoka . |
| 5,047,981 | 9/1991 | Gill et al. ................................ 365/185 |
| 5,084,843 | 1/1992 | Mitsuishi et al. ....................... 365/218 |
| 5,101,381 | 3/1992 | Kouzi ..................................... 365/218 |
| 5,136,541 | 8/1992 | Arakawa ................................ 365/185 |
| 5,293,337 | 3/1994 | Aritome et al. ........................ 365/185 |
| 5,341,329 | 8/1994 | Takebuchi .............................. 365/185 |

OTHER PUBLICATIONS

A 5V–Only EEPROM with Internal Program/Erase Control; Art Lancaster, Bob Johnstone, Jeff Chritz, Gerry Talbot, David Wooten; Inmos Corp., Colorado Springs; paper 4.7; reprinted from the IEEE ISSCC Dig. Tech. Pap., pp. 164–165, 302, 1983.

*Primary Examiner*—David C. Nelms
*Assistant Examiner*—Son Dinh
*Attorney, Agent, or Firm*—Oblon, Spivak, McClelland, Maier & Neustadt

[57] ABSTRACT

A NAND cell type EEPROM has bit lines, each of which is associated with a NAND cell unit including a series array of four memory cell transistors. Each transistor is a MOSFET with a control gate and a floating gate for data storage. The memory cell transistors are connected at their control gates to word lines, respectively. One end of the NAND cell unit is connected through a first select transistor to a corresponding bit line; the other end thereof is connected via a second select transistor to a source voltage. The memory cell transistors and the select transistors are arranged in a well region formed in a substrate. In an erase mode, the bit line voltage, the substrate voltage and the well voltage are held at a high voltage, whereas the word lines are at zero volts. The gate potential of the select transistors is held at the high voltage, whereby the internal electric field of these select transistors is weakened to improve the dielectric breakdown characteristic thereof.

17 Claims, 9 Drawing Sheets

ELECTRICALLY ERASABLE PROGRAMMABLE READ-ONLY MEMORY WITH ELECTRIC FIELD DECREASING CONTROLLER

This is a continuation of application Ser. No. 08/201,036 filed on Feb. 24, 1994, now U.S. Pat. No. 5,402,373, which is a continuation of application Ser. No. 07/683,733 filed on Apr. 11, 1991, now U.S. Pat. No. 5,293,337.

BACKGROUND OF THE INVENTION

1. Field of the Invention

The present invention relates generally to semiconductor memories and more particularly to non-volatile read-only memories which are programmable and which may be electrically erased by the user.

2. Description of the Related Art

With the increasing needs for high performance and reliability of digital computer systems, development of a semiconductor memory with large data storage capacity which can replace existing non-volatile data storage devices for digital computer systems, such as a magnetic floppy diskette drive unit, a fixed disk unit (also known as a "hard-disk drive unit"), or the like, has been demanded strongly.

To meet such requirement, specific electrically erasable and programmable read-only memories have been developed recently, which have been improved in their cell-packing density by decreasing the number of transistors required for each memory cell on a chip substrate of limited size. The memories may be referred to as the "EEPROM" in the present specification.

A very recent development has been the "NAND type EEPROM" which does not require the use of any extra transistor as a switching gate for each memory cell and thus can exhibit dramatic density improvement. With the NAND cell type EEPROM, series circuits of floating gate type metal oxide semiconductor field effect transistors, or MOSFETs, are arranged so that each series transistor circuit is connected with a corresponding one of data transfer lines through a single switching transistor. The data transfer lines may be called the "bit lines." When the switching transistor is rendered conductive, the series circuit of floating gate type MOSFETs associated therewith is connected selectively to the corresponding bit line. In this sense, the switching transistor is ordinarily called the "select transistor" among those skilled in the art.

Each of the series-arrayed floating gate type MOSFETs serves as a minimum element for digital data storage, which may be considered to correspond to a "memory cell" as in conventional dynamic random access memories or DRAMs. (In some cases, one series circuit of MOSFETs will be called a "memory cell." Such terminology itself is not so important. In this patent specification, each series array of MOSFETs will be named as a "NAND cell unit.") Generally, each transistor array includes four, eight or sixteen floating gate type MOSFETs. Each MOSFET has a control gate connected to a corresponding word line and a floating gate for storing carriers indicative of a logic "1" or "0." Since each memory cell can be formed of one floating gate type MOSFET, the integration density of the EEPROM can be enhanced and therefore the memory capacity thereof can be increased.

With the currently available NAND cell type EEPROM, data is sequentially written into the floating gate type MOSFETs, that is, memory cell transistors in each NAND cell unit. In a case where logic data is written into the EEPROM at a desired memory address, that is, into a selected one of the floating gate type MOSFETs of the designated NAND cell unit, a high voltage Vpp and an intermediate voltage are used. The high voltage is typically a 20-volt voltage; the intermediate voltage Vppm has a potential level between the power source voltage Vcc of the EEPROM and the high voltage Vpp and is typically at 10 volts when the power source voltage Vcc is 5 volts. The high voltage Vpp is applied to the control gate electrode of a selected memory cell transistor and the intermediate voltage Vppm is applied to the control gate electrodes of non-selected memory cell transistors lying between the selected memory cell transistor and the select transistor. The non-selected memory cell transistors are rendered conductive.

Under such condition, when a voltage representing the logic "1" data (typically, a zero-volt voltage) is given to a corresponding bit line, this data voltage is transferred to a target memory cell—more specifically, the drain layer of a selected floating gate type MOSFET—through the nonselected memory cell transistors that remain conductive. A high electric field is thus created between the floating gate electrode and the drain of the selected memory cell transistor. This results in that electrons are injected by tunneling effect from the substrate (drain) to the floating gate electrode. The threshold value of the selected memory cell transistor is shifted along the direction of positive polarity. The logic "1" data is stored ("programmed") at the desired cell address. When the intermediate voltage Vppm is applied as a voltage indicative Vcc of the logic "0" data to the bit line, the injection of electrons does not occur in the selected floating gate type MOSFET. The threshold value of this MOSFET is thus kept unchanged. This state is defined as the logic "0" data storing state.

The memory cell transistors in the NAND cell type EEPROM is simultaneously erased with a predetermined size of block being as a unit, which is generally the entire portion of one chip of the EEPROM is dealt as one block. This is so-called "simultaneous erasing." At this time, all of the NAND cell units of the EEPROM are electrically separated from the bit lines, the substrate and a common source voltage. The control gate electrodes of all the memory cell transistors are at 0 volts and the substrate voltage (and the well potential if the NAND cell units are formed in a well region) is set to be the high voltage Vpp. As a result, in all of the memory cell transistors, electrons are moved or released from the floating gate electrodes thereof to the substrate (or the well region). The threshold values thereof are shifted along the direction of negative polarity. The stored data items are electrically erased at the same time.

To read stored data selectively from a designated one of the memory cell transistors, a zero-volt voltage is applied to the control gate electrode of the selected memory cell transistor. The control gate electrodes of the remaining one of the memory cell transistors are at a power supply voltage Vcc (5 volts, for example). These nonselected transistors are rendered conductive due to the application of power supply voltage Vcc. Under such a condition, the logical value of the data stored in the selected memory cell transistor may be judged by sensing whether current flows in the common source line, which is also associated with specific NAND cell unit containing the selected memory cell transistor.

With the NAND cell type EEPROM mentioned above, the select transistors are being applied with the zero-volt voltage at their gate electrodes, while the substrate is applied with the high voltage Vpp in the data erase mode. A high electric field will be created within gate insulation layers of the select transistors. After the above-mentioned simultaneous erasing is repeatedly executed, the gate insulation layers of the select transistors will be decreased in the dielectric breakdown characteristic, or withstanding voltage characteristic thereof. Once dielectric breakdown occurs in any one of the select transistors, effective data accessing performance will no longer be expected in the NAND cell type EEPROM. The same problem has been inherent in NOR cell type EEPROMs.

SUMMARY OF THE INVENTION

It is therefore an object of the present invention to provide a new and improved non-volatile semiconductor memory device which is excellent in its operating reliability.

In accordance with the above object, the present invention is drawn to a specific non-volatile semiconductor memory device, which comprises a semiconductive substrate, parallel data transfer lines which are provided on the substrate, parallel program lines which are arranged on the substrate and insulatively intersect with the data lines to define crossing points therebetween, and field effect transistors which are provided on the substrate as memory cell transistors for the device and arranged at the crossing points between the data lines and the program lines. Each transistor has a carrier storage section and a control gate which is connected to a corresponding one of the program lines.

The memory cell transistors are arranged in a preselected number of cell units, each of which includes one or a plurality of memory cell transistors arrayed in a series fashion. A switching transistor having an insulated gate electrode is arranged at a first end portion of each cell unit to selectively connect it to a corresponding one of the data lines. The electric field in the switching transistor is specifically decreased by applying the insulated gate electrode thereof with a specific voltage which is same in its polarity as a voltage of a preselected potential to be applied to the substrate while an erase operation is being performed in the cell units.

The foregoing and other objects, features and advantages of the invention will become more apparent in the detail description of preferred embodiments presented below.

BRIEF DESCRIPTION OF THE DRAWINGS

The invention is best understood by reference to the accompanying drawings, in which.

DETAILED DESCRIPTION OF THE PREFERRED EMBODIMENTS

Figure 1:
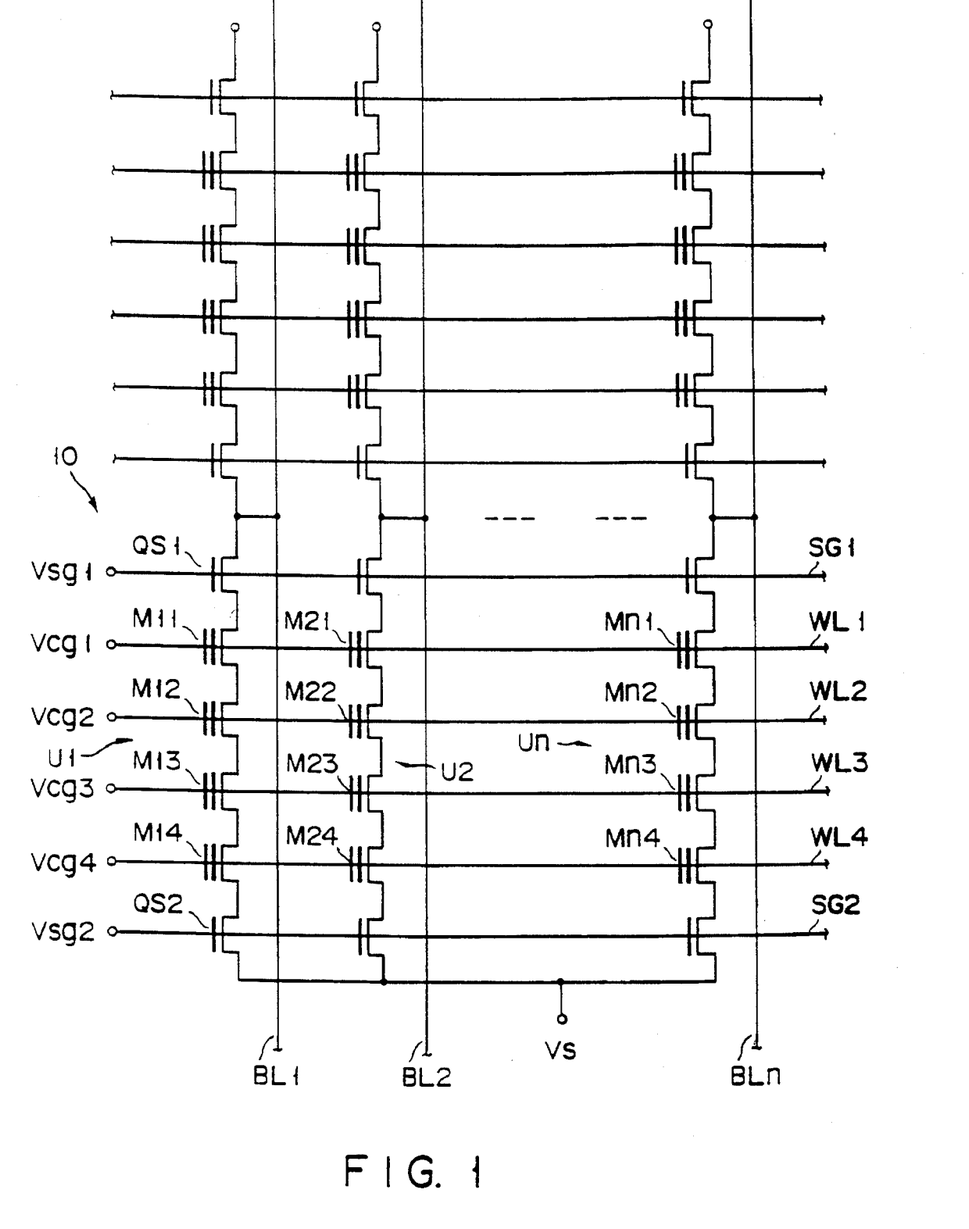
FIG. 1 is a diagram schematically showing the main configuration of a memory array section of a NAND cell type EEPROM in accordance with the present invention.
Figure 2:
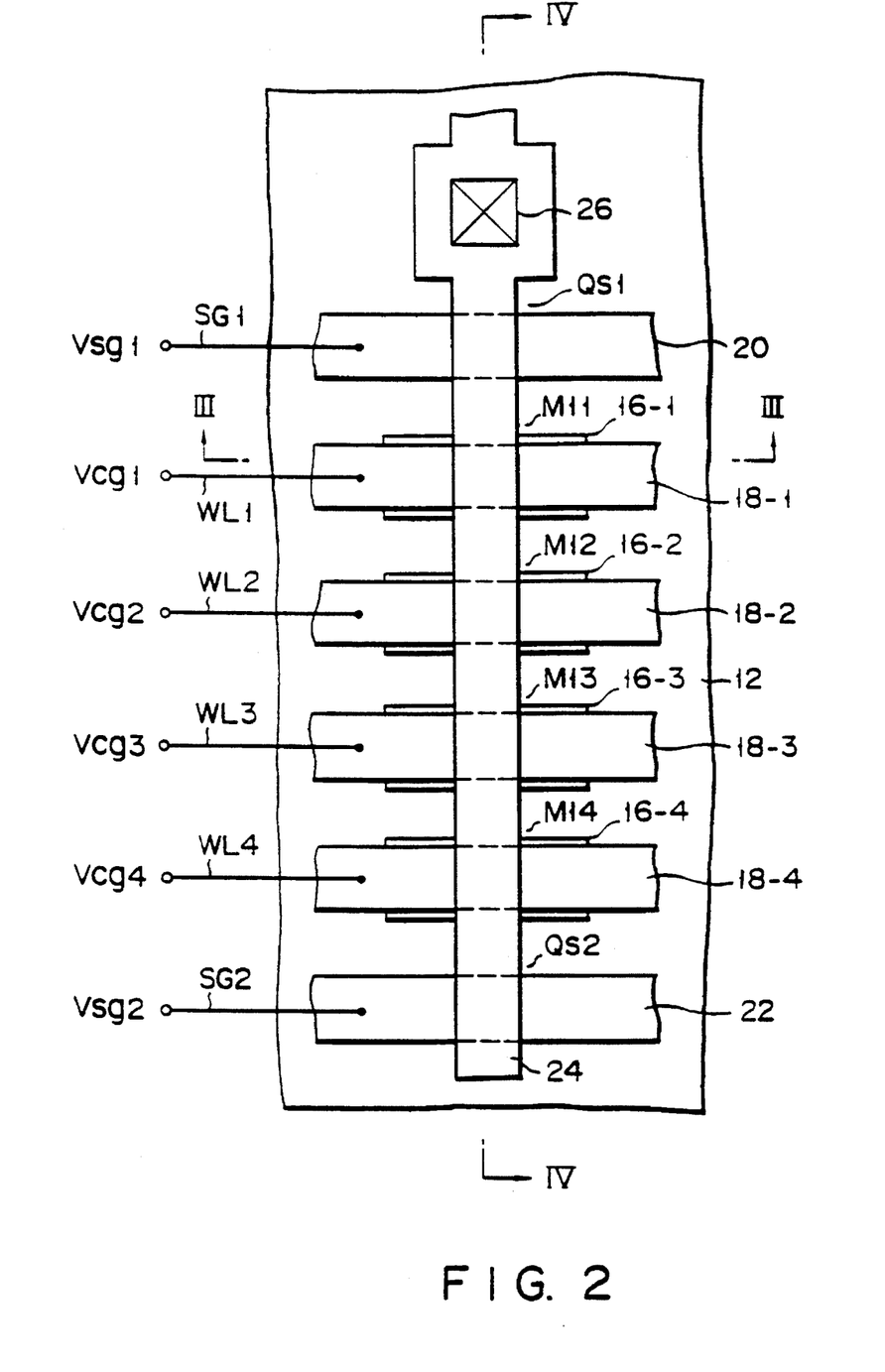
FIG. 2 is a diagram schematically showing a simplified plan view of a certain NAND cell unit in the EEPROM shown in FIG. 1.

Referring to FIG. 1, a NAND cell type EEPROM in accordance with one preferred embodiment of the present invention is generally designated by reference numeral "10." The NAND cell type EEPROM 10 has parallel data transfer lines BL, and parallel program lines WL which insulatively intersect the data transfer lines BL on a silicon substrate 12 (visible in FIG. 2). The data transfer lines BL are called the "bit lines"; the program lines WL are called the "word lines."

Each bit line BLi (i=1, 2, ..., n) is connected, in its lower half section, with a series circuit Ui of a preselected number of transistors. The transistors may be floating gate tunneling metal oxide semiconductor field effect transistors (FAT-MOSFETs) M, wherein minority carriers may tunnel to charge or discharge a floating gate under the influence of an applied electric field. In this embodiment, each series transistor circuit Ui consists of four floating gate tunneling MOSFETs Mi1, Mi2, ..., Mi4. Regarding the series circuit U1, for instance, floating gate tunneling MOSFETs M11, M12, ..., M14 are arrayed in series to each other as shown in FIG. 1. Each MOSFET Mij (i=1, 2, ..., n; j=1, 2, ..., 4) acts as a "memory cell" for storing a binary bit data, i.e., logic "1" or "0." The group of the four series arrayed memory cells will be referred to as the "NAND cell unit" hereinafter. The floating gate tunneling MOSFETs M will be called the "memory cell transistors," or simply "memory cells." It is to be noted that the matrix configuration of row and column of memory cells in the upper half section shown in FIG. 1 is essentially similar to that described above; accordingly, it is omitted for the sake of simplicity in illustration.

In each NAND cell unit Ui, the memory cell transistors Mi1, Mi2, ..., Mi4 are electrically connected at their control gate electrodes with the word lines WL1, W12 ..., WL4, respectively. Each of the NAND cell units U1, U2, ..., Un is connected to a corresponding one (BLi) of the bit lines BL via a first insulated-gate transistor Qs1, which may be a MOSFET. For example, the NAND cell unit U1 is connected to the bit line BL1 through a MOSFET Qs1. The MOSFET Qs1 in the NAND cell unit U1 is connected, together with those in the remaining NAND cell units U2, ..., Un, to a control gate line SG1 at their control gate electrodes. Each MOSFET Qs1 is selectively rendered conductive in response to a voltage signal Vsg1 which is applied to the control gate line SG1. When conductive, a NAND cell unit Ui associated with the select transistor Qs1 is connected to a corresponding bit line BLi. In this sense, the switching MOSFET Qs1 will be called the "first select transistor" in the following description.

As shown in FIG. 1, each of the NAND cell units U1, U2, .... Un is connected to a common source voltage Vs through a second insulated-gate transistor Qs2, such as a MOSFET. In the NAND cell unit U1, as an example, the second MOSFET Qs2 is connected between the common source voltage Vs and the source electrode of the last-stage of memory cell transistor M14 in the NAND cell unit U1. The second MOSFET Qs2 is connected to a second control gate line SG2 at its control gate electrode, together with the corresponding MOSFETs in the remaining NAND cell units U2,..., Un. Each MOSFET Qs2 performs a switching operation in response to a voltage signal Vsg2 to be applied to the control gate line SG2. When the second MOSFET Qs2 is rendered conductive, a corresponding NAND cell unit Ui associated therewith is electrically conducted to the common source voltage Vs. From now on, the switching MOSFET Qs2 will be called the "second select transistor."

A plan view the four memory cell transistors M11 to M14 in the NAND cell unit U1 is illustrated in FIG. 2. In this illustration, any dielectric layers ordinarily formed between stacked semiconductors layers are omitted for the illustrative purpose only. Each of the memory cell transistors M11 to M14 has an electrically floating gate electrode (floating gate) 16-i (i=1, 2, ..., 4) which is insulatively provided above a P type semiconductor well region 12 formed in the top surface of an N type semiconductor substrate 14 (see FIG. 3 for details). Each memory cell transistor also has a control gate electrode (control gate) 18-i which insulatively overlines the floating gate. The control gates 18-1, 18-2, 18-3, and 18-4 function as the word lines WL1, WL2 ..... WL4, respectively. In FIG. 2, the underlying floating gates 16 are so illustrated that they are greater in width than the control gates 18. This is merely emphasis in symbolic illustration. In practice, the width of the floating gates is substantially the same as that of the control gates. The width of the both electrodes is 1 micrometer, for example. The first and second select transistors Qs1 and Qs2 are located at both end portions of the nand cell unit U1. These select transistors Qs1 and Qs2 have control gates 20 and 22, which will be called the "select gates."

The bit line BL1 consists of a metallic layer 24, which is elongated to cross insulatively the control gates 18, the first select gate 20 and the second select gate 22. The first select transistor Qs1 is electrically connected by a contact hole section 26 to the metallic layer 24 which serves as the bit line BL1 at the drain thereof. The second select transistor Q12 is conducted at its source with a well voltage Vwell, which corresponds to the common source voltage Vs.

Figure 3:
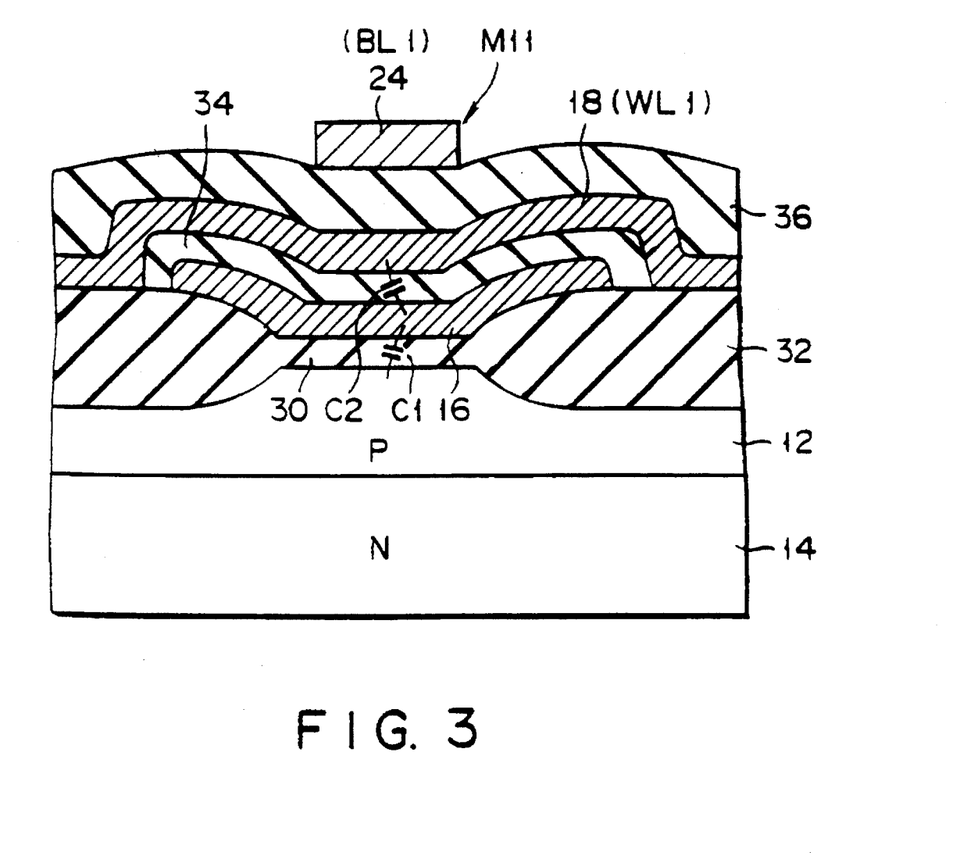
FIG. 3 is a diagram schematically illustrating a sectional view of the cell unit along a line III—III shown in FIG. 2.

The cross-sectional structure of one of the memory cell transistors M included in the NAND cell unit U1—transistor M11, as an example—is shown in detail in FIG. 3. As shown in FIG. 3, the P type well region 12 is formed in a selected area of the top surface of the N type substrate 14. An insulative thin-film layer 30 is deposited in an element-formation area, which is defined in the top surface of the P type well region 12 by an insulative element separation layer 32. The insulative layers 30 and 32 may be thermal oxide layers. The insulative layer 30 is 11 nanometers in its thickness. This layer 30 serves as a gate insulation thin film. The floating gate 16 is stacked on the gate insulation layer 30; its length is suitably arranged so as to ride on the element separation layer 32 at its opposite ends. The floating gate 16 is covered by an insulative layer 34. This insulative layer is 35 nanometers in thickness. On the insulative layer 34 is formed the control gate 18, which is substantially the same in its thickness as the floating gate 16. The control gate 18 is elongated so as to correspond to the word line WL1 as shown in FIG. 3. The floating gate 16 defines a certain capacitance C1 between itself and the well region 12; it also defines another capacitance C2 between itself and the control gate 16. The capacitance C1 is smaller than the capacitance C2. (C1 may be greater than C2 in a case wherein the memory integration density is much increased; even in such a case, the aforementioned voltage application scheme need not be changed.) The control gate 18 is covered with the insulative layer 36. The metallic wiring layer 24 serving as the bit line BL1 is arranged on the insulative layer 36.

Figure 4:
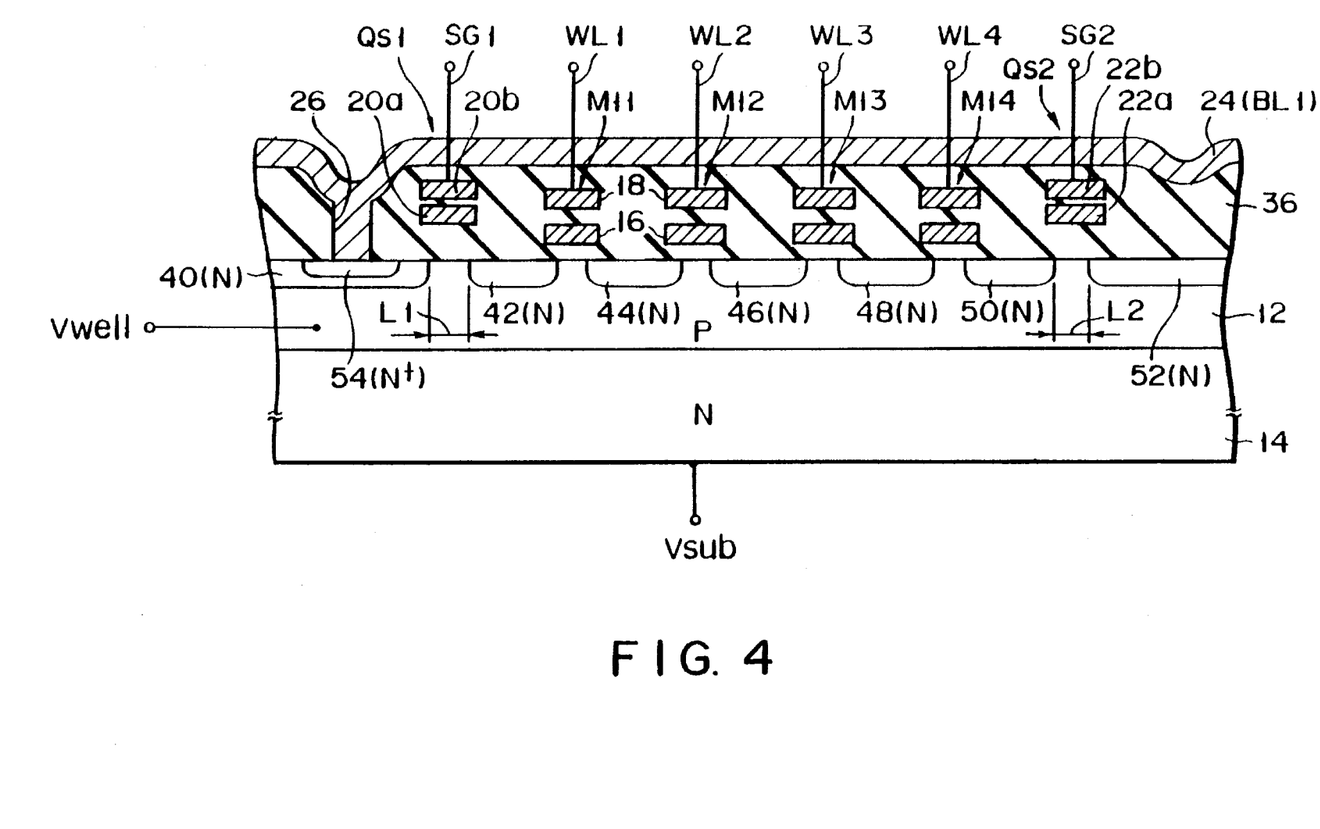
FIG. 4 is a diagram schematically showing a sectional view of the cell unit along a line IV—IV shown in FIG. 2.

As shown in FIG. 4, N type semiconductor diffusion layers 40, 42, 44, 46, 48, 50, and 52 are arranged in the surface of the P type well region 12. These layers are aligned along the extending direction of the bit line BL1 with a predetermined intervals defined thereamong. The N type layer 40 acts as the drain of the first select transistor Qs1. A heavily-doped N type (N+ type) diffusion layer 54 is provided in this layer 40. It may be easily understood by just viewing FIG. 4 that the N+ type layer 54 is connected by the contact-hole section 26 with the wiring layer 24 serving as the bit line BL1. The N type layer 42—functions as the source of the first select transistor Qs1. The N type layer 42 acts also as the drain of the neighboring memory cell transistor M11. Similarly, the N type layer 44 serves as the source and drain of two neighboring memory cell transistors M11 and M12. The N type layer 52 is used as the source of the second select transistor Qs2.

The insulated select gate 20 of the first select transistor Qs1 has a double-layered structure consisting of two stacked polycrystalline silicon layers 20a and 20b. The select gate 22 of the second select transistor Qs2 has a similar double-layered structure of two stacked polycrystalline silicon layers 22a and 22b. The channel length L1 of the first select transistor Qs1 is greater than that of the second select transistor Qs2. The increased channel length L1 of the first select transistor Qs1 is for preventing any "punch-through" phenomenon from being caused when the high voltage is applied by the bit line BL1. (In some cases, if there is no risk of generation of the punch-through, the channel lengths L1 and L2 will be allowed to be same as each other under the same design rule.)

The operation modes of the NAND cell type EEPROM 10 thus constructed will now be described hereinafter. For the sake of simplicity, the following description is made with respect to one typically selected NAND cell unit U1; the same goes with the remaining NAND cell units U2 . . . Un. Basically, the simultaneous data erase operation and selective write operation that follow are realized by minority carrier movement based on what is called the "F-N tunneling" (Fowler-Nordheim tunneling) effect between the P type well region 12 and the floating gate of a designated memory cell transistor or transistors.

Figure 5:
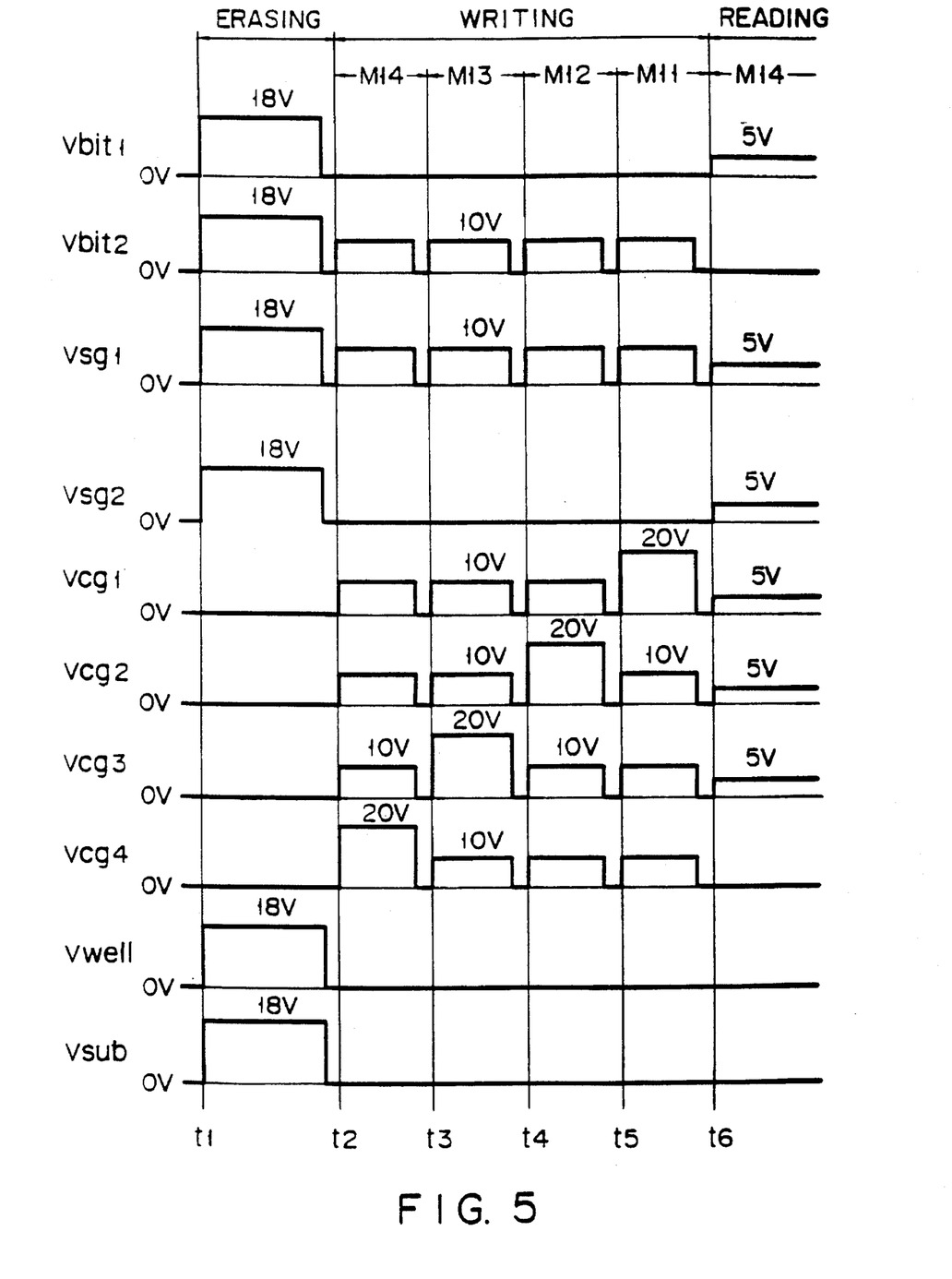
FIG. 5 is a diagram showing a timing chart of the main voltage signals to be applied to the main parts of the NAND cell type EEPROM shown in FIGS. 1 to 4 during different modes of operations.
Figure 6:
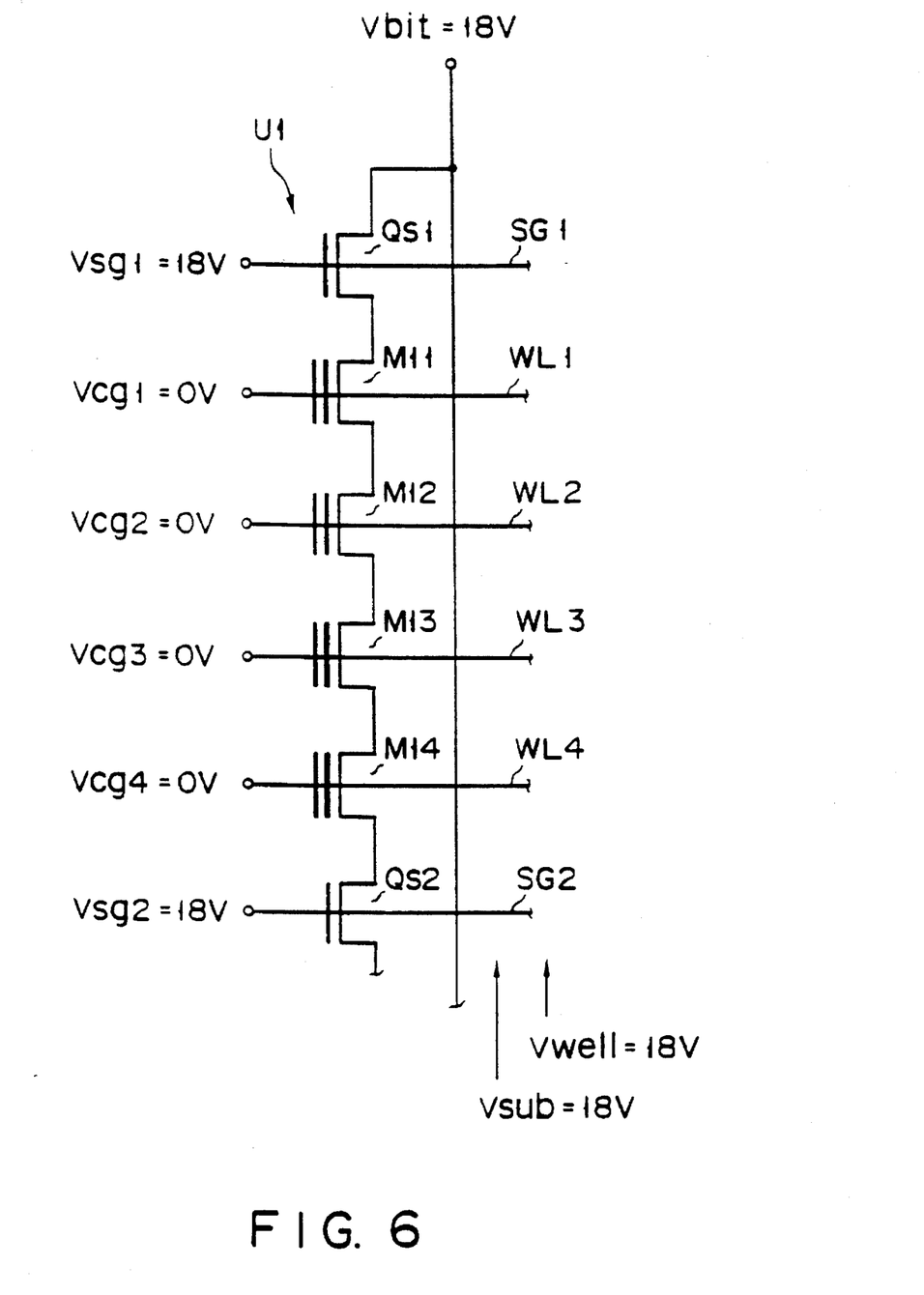
FIG. 6 is a diagram showing a voltage application condition that several kinds of voltage signals are applied to the main parts of the NAND cell type EEPROM in an erase mode.

When the EEPROM 10 is set in an erase mode at a time t1, all of the memory cell transistors in the NAND cell unit U1 may be erased simultaneously by applying several kinds of voltages to the bit line BL1 associated therewith, the word lines WL1 to WL4, and the select gate lines SG1 and SG2 as shown in the illustration of FIG. 5. More specifically, in the simultaneous erase mode that may be defined in a time period ranging from the time t1 to a time t2 in FIG. 5, a zero-volt voltage is applied to all of the word lines WL1 to WL4. The well potential Vwell and the substrate potential Vsub are held at the high voltage (18 volts, for example). The high voltage may potentially range from zero volts to the potential level (18 volts, in this case) of the well potential Vwell and the substrate potential Vsub. Characteristically, the high voltage (=18 volts) is also applied to both the first select gate line SG1 and the second select gate line SG2. The select transistors Qs1 and Qs2 are thus rendered conductive;

the series array of four memory cell transistors M11 to M14 of the NAND cell unit U1 is electrically connected with the well potential Vwell and the corresponding ponding bit line BL1. A voltage Vbit on the bit line BL1 has its potential that is equal to the high voltage (=18 volts). During the erase operation, the adjacent bit line BL2 is similarly held at the high voltage together with the remaining bit lines. The applied voltages are visually summarized in FIG. 6.

By applying the above voltages, in all the memory cell transistors M including the memory cell transistors M11 to M14 in the NAND cell unit U1, minority carriers (electrons) that have been charged in their floating gates 16 are simultaneously released by F-N tunneling the P type well region 12. As a result, the threshold value voltages (threshold voltages) of all of the memory cell transistors M are shifted to have a negative value. The resultant state corresponds to the data-erased state.

Thereafter, the EEPROM 10 is set in a write mode. In the NAND cell unit U1 (similarly in the other NAND cell units), the memory cell transistors included therein are subjected sequentially to data writing (programming) operations in a specific order of the transistors M14, . . . , M12, and M11. The last-stage memory cell transistor (M14) which is positioned most far from the first select transistor Qs1 is first selected for the data writing; the first-stage memory cell transistor M11 is designated last.

When the last-stage memory cell transistor is selected in the NAND cell unit U1, a control gate voltage Vcg4 of a high potential such as 20 volts is applied to the word line WL4 associated with it during a time period ranging from the time t2 to a time t3. Control gate voltages Vcg1 to Vcg3 to be applied to the remaining word lines WL1 to WL3 are caused to maintain the intermediate voltage such as 10 volts. A voltage Vsg1 on the first select gate line SG1 associated with the first select transistor Qs1 is held at the intermediate voltage (=10 volts), so that the NAND cell unit U1 is connected at its one end (i.e., the drain 42 of the memory cell transistor M11) to the bit line BL1. A voltage Vsg2 on the second select gate line SG2 associated with the second select transistor Qs2 is also held at the intermediate voltage; accordingly, the NAND cell unit U1 is connected at the other end thereof (i.e., the source 50 of the memory cell transistor M14) to the common source voltage vs.

Under such a condition, the bit line voltage Vbit1 is set to be at a particular potential which is selected in accordance with a writing data of logic "1" or "0." If a logic "1" is to be written or programmed in the selected memory cell transistor M14, the data voltage is zero volts as shown in FIG. 5. Otherwise, if a logic "0" is to be stored, the data voltage is 10 volts. When the bit line voltage Vbit1 is 0 volts, this voltage is transferred to the drain 48 (see FIG. 4) of the selected transistor M14 through non-selected memory cell transistors M11 to M13 which are rendered conductive and serve as mere "data transfer gates." In the selected transistor M14, electrons are injected by tunneling or "tunneled" from its drain into the floating gate 16-4 (see FIG. 2). The threshold voltage of this transistor M14 is shifted to have a positive value. The shifted state may correspond to a logic "1" programmed state. It is noted that, when the bit line voltage Vbit1 is 10 volts, the above tunneling does not occur. The threshold voltage of the selected memory cell transistor M14 is not shifted: It remains unchanged.

As shown in FIG. 5, during the subsequent period ranging between the time t3 and a time t4, the next memory cell transistor M13 is now selected in the NAND cell unit U1. In this case, similarly to the aforementioned case, the control gate voltage Vcg3 of the high voltage (=20 volts) is applied to the word line WL3 connected to the selected transistor M13; the voltages Vcg1, Vcg2, and Vcg4 of the intermediate potential (=10 volts) are supplied to the remaining word lines WL1, WL2, and WL4. The basic mechanism concerning the data writing in the transistor M13 is substantially the same as that in the case described above. Subsequently, the memory cell transistor M12 is selected. The memory cell transistor M11 is then selected. Data write operation for each of these transistors are performed in the same manner as described above.

The EEPROM 10 is set in a read mode at a time t6. Assume that the word line WL4 is designated. At this time, a zero-volt voltage is applied to the designated word line WL4 only. The remaining word lines WL1 to WL3 are being applied with a read voltage of a preselected potential (5 volts, for example). The 5-volt voltage is also applied to the first and second select gate lines SG1 and SG2. An appropriate voltage is applied to the bit line BL1 to determine whether a read data is the logic "1" or "0" by detecting whether any current flows in the bit line BL1 using a known sense amplifier circuit. The appropriate voltage may be selected from a potential range between 1 volt and 5 volts.

According to the EEPROM 10 embodying the present invention, while the high voltage (=18 volts) is applied to the P type well region 12 and the substrate 14 in the simultaneous erase mode, the same voltage is also applied to the first and second select gate lines SG1 and SG2. Applying such high voltage to the select gate line SG1 enables a weakening of the internal electric field in the gate insulation film thereof in each NAND cell unit U1, U2 ..... Un. It makes it possible to moderate or eliminate undesirable decrease in the dielectric withstanding characteristic (dielectric breakdown rating) that may be caused after erase operations are repeatedly carried out in the EEPROM 10, and therefore to "save" decline in the basic characteristics of the EEPROM 10 during the repeated erase operations. This will contribute to improvement in the operation reliability of the EEPROM 10.

The above features of the present invention will be able to be applied not only to the NAND cell type EEPROMs, but also to NOR cell type ones. The voltage applying technique in the case of such NOR cell type EEPROM will now be described below.

Figure 7:
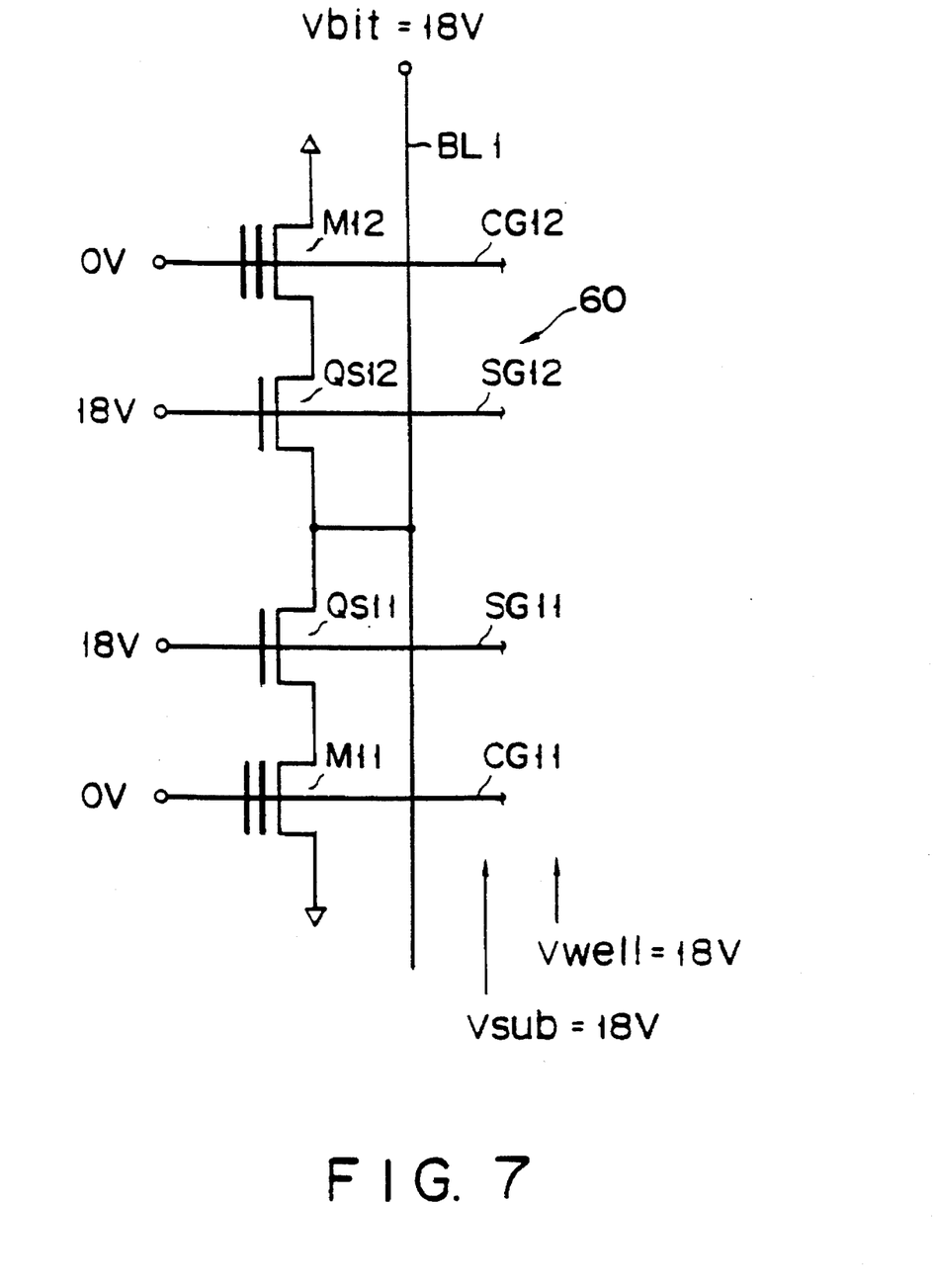
FIG. 7 is a diagram showing a voltage application condition that several kinds of voltage signals are applied in an erase mode to the main parts of a NOR cell type EEPROM in accordance with another embodiment of the invention.

As shown in FIG. 7, a NOR cell type EEPROM 60 includes two memory cell transistors M11 and M12. These transistors are associated with a bit line BL1. The memory cell transistor M11 is connected via a select transistor Qs11 to the bit line BL1. The other memory cell transistor M12 is connected to the same bit line BL1 through another select transistor Qs12. The select transistors Qs11 and Qs12 are connected at their gate electrodes to select gate lines SG11 and SG12, respectively. The remaining arrangement of this embodiment is principally the same as that of the aforementioned embodiment. In an erase mode, while a high voltage of 18 volts, for example, is being applied to the P type well region 12 and the substrate 14, the same is also applied to the first and second select gate lines SG11 and SG12. With such voltage application, the internal electric field in the gate insulation layers of these select gate transistors SG11 and SG12 can be weakened in intensity, thereby improving the operation reliability of the NOR cell type EEPROM 60 due to the same reasons as in the prior embodiment.

Very importantly, when applied to the NAND cell type EEPROMs, the above "electric field weakening" feature of the present invention can offer a surprising technical effect:

the possibility of a "block erase" operation that has been strongly demanded among those skilled in the art for a long time. In other words, with the electric field weakening feature in the select gates, the data erasing can be performed selectively with respect to desired ones of the memory cell transistors among the NAND cell units U1, U2 . . . , Un, in addition to the above mentioned simultaneous erase operation. The rest of this description will be devoted to the explanation of such a "block erase."

Figure 8:
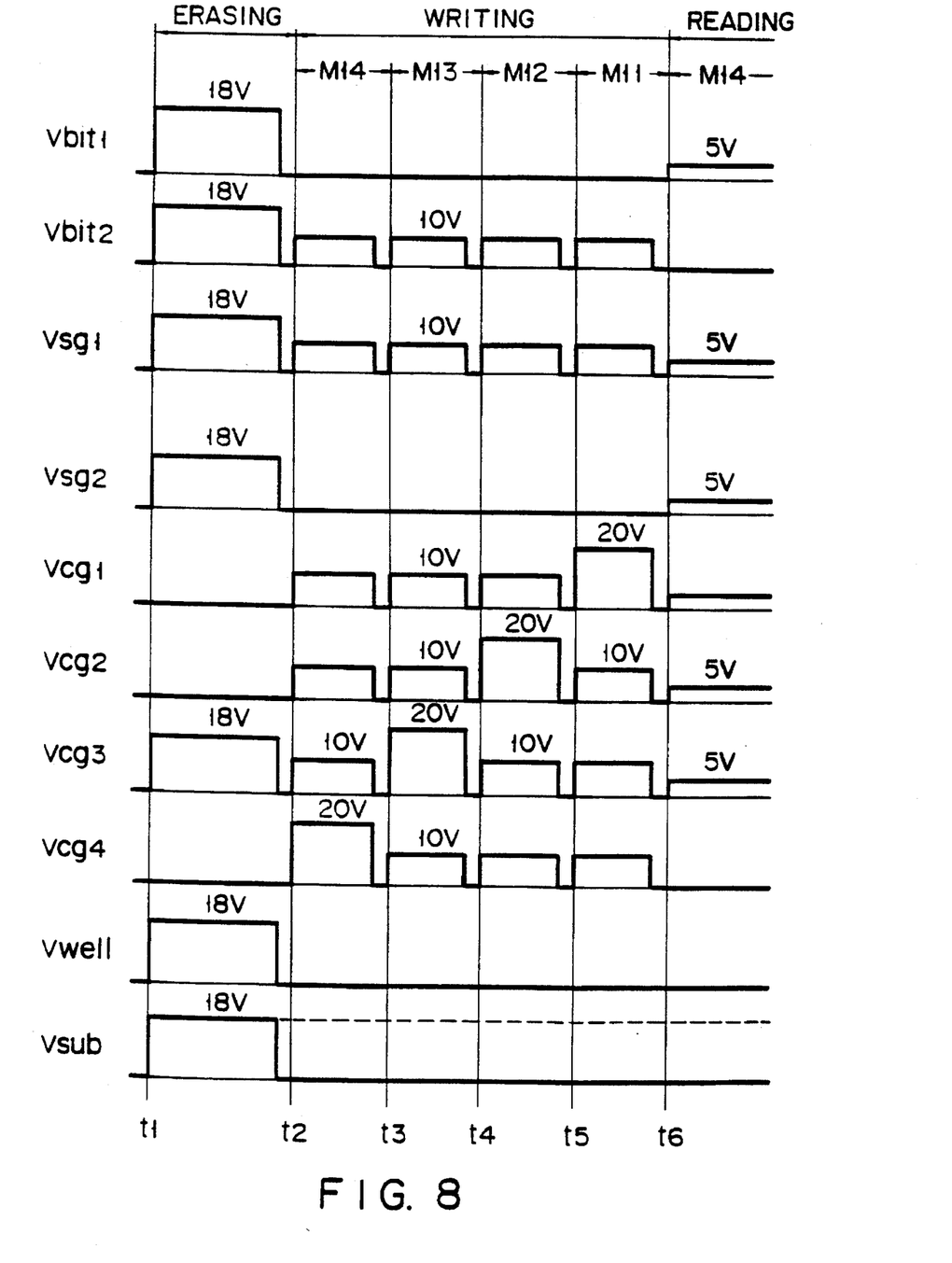
FIG. 8 is a diagram showing a timing chart of the main voltage signals to be applied to the main parts of the NAND cell type EEPROM shown in FIGS. 1 to 4 in a block-erase mode.
Figure 9:
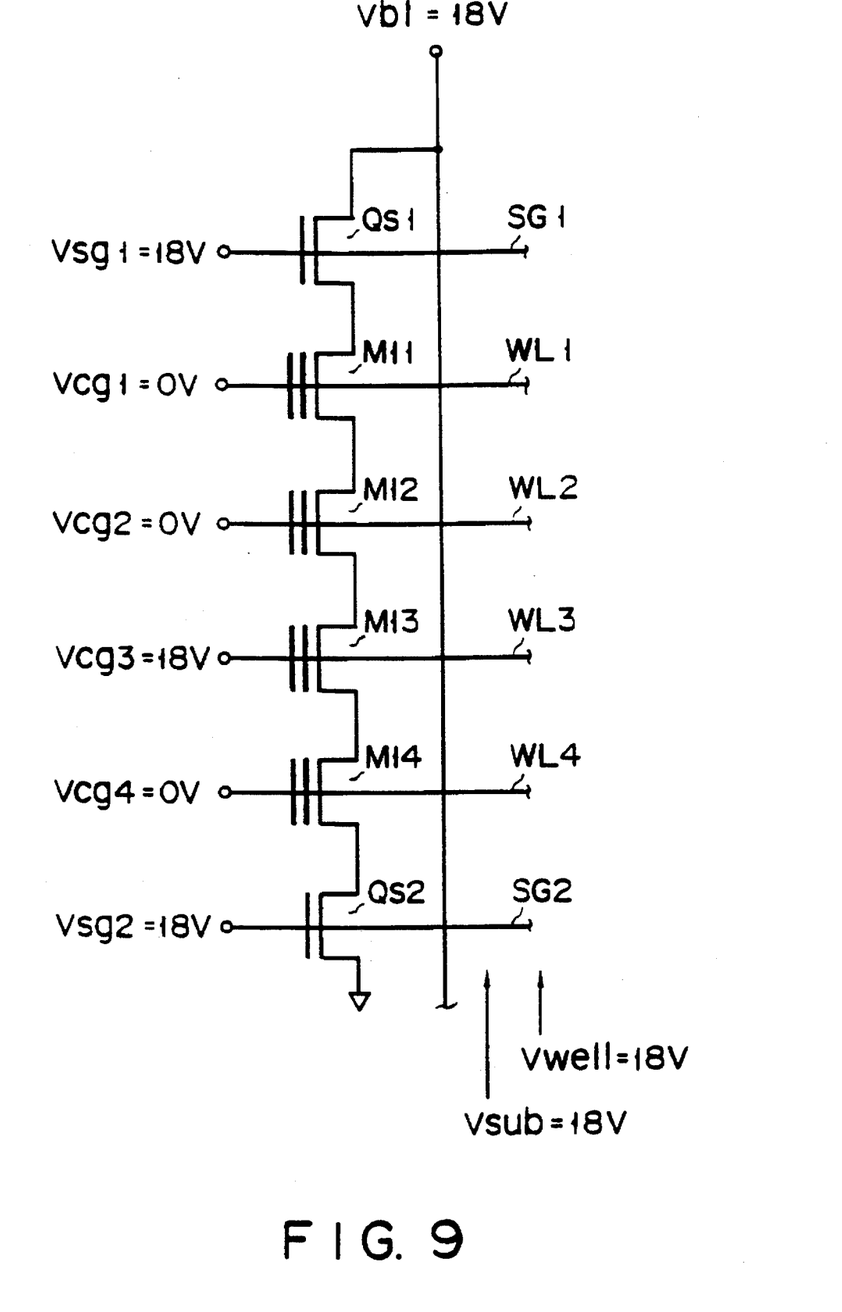
FIG. 9 is a diagram showing a voltage application condition that several kinds of voltage signals are applied in a data erase mode to the main parts of a NAND cell type EEPROM in the block-erase mode.

In the NAND cell type EEPROM 10 which has been already described with reference to FIGS. 1 through 4, let's consider the case wherein, without changing the data storage condition of the memory cell transistor M13, data erase is performed only for the remaining memory cell transistors M11, M12 . . . , M14 in the NAND cell unit U1. In such case, as shown in FIG. 8, while the high voltage (= 18 volts) is applied to the P type well region 12 and the N type substrate 14, the same voltage is applied also to the word line W13 associated with a specific memory cell transistor M13 that should not be erased. A zero-volt voltage is applied to the remaining word lines WL1, WL2, and WL4. Such voltage application scheme in the NAND cell unit U1 in the "block erase" mode is visually summarized in FIG. 9 for the aim of easy understanding.

With such voltage application, any electric field is prevented from being created between the floating gates and the P type well region 12 in each of the memory cell transistors M13, M23 . . . , Mn3 aligned along the word line WL3. For this reason, electrons will not be released from the floating gates of these specific memory cell transistors; they are prevented from being subjected to data erasing. Since the remaining word lines WL1, WL2, and WL4 are applied with a zero-volt voltage in the same manner as in the earlier embodiment, data erasing is executed at the other memory cell transistors M11, M12, M14, M21, M22, M24 . . . Mn1, Mn2, Mn4. If a control gate line constitutes a word line WLi, it becomes possible that while only one word data is maintained as it is, the remaining plural pieces of word data can be erased selectively. Such selective data erasing may be called the "block erase" operation. The data write and read operations in this case may be same as in the above embodiment 10, as is easily understood from FIG. 8.

The present invention is not limited to the above-described specific embodiments and may be practiced or embodied in still other ways without departing from the spirit or essential character thereof.

For example, the high voltage to be applied to the first and second select gate lines SG1 and SG2 in the simultaneous erase mode—or the high voltage to be applied to a specific word lines associated with non-target memory cell transistor M13 that should not be erased in the block erase mode for the purpose of improvement in the dielectric withstanding characteristic—should not necessarily be limited to one having the same potential level as the voltage being applied to the P type well region 12 and the substrate 14. In accordance with practical application of the invention, the voltage potential level may be freely modified to various levels of voltages within an allowable range.

Attention should be paid to the following fact: the "high voltage" for improving the dielectric withstanding characteristic must be designed so that the high voltage to be applied to either the select gate lines SG1 and SG2 or the specific word line is same in polarity as the "high voltage" which will be applied to the well region 12 and the substrate 14, i.e., it is positive in its polarity. In addition, it is preferable that the former is so arranged that the difference between itself and the latter is not larger than 10 volts. Accordingly, if the high potential level of the voltages Vwell Vnd Vsub is 18 volts, it is recommended that the high potential level of the voltage Vsg1, Vsg2, or Vcg3 is selected from the range defined between 8 volts and 18 volts. The design rule is not more than a recommendation. In another practical application, it will be possible to use the power supply voltage Vcc (typically 5 volts) as the above "high voltage" to be applied to the first and second select gate lines SG1 and SG2. Even in such a case, improvement in the dielectric withstanding characteristic may remain expectant.

What is claimed is:

1. An electrically erasable non-volatile semiconductor memory, comprising:

data transfer lines on a semiconductor substrate being applied with a first voltage of a preselected potential, program lines insulatively crossing said data transfer lines on the substrate to provide crossing points therebetween;

a plurality of cell units associated with said data transfer lines and said program lines, each of said cell units having a plurality of memory cell transistors arranged at said crossing points, each of said transistors having a carrier storage layer and a control gate at which a corresponding program line is connected to each transistor; and a switching transistor with an insulated gate provided in each cell unit, for selectively connecting said cell unit to a corresponding data transfer line; wherein a designated one of said program lines is caused to be at a second voltage which has a same polarity as a polarity of said first voltage, while the remaining ones of said program lines are caused to be held at a preselected voltage potential which changes the amount of carriers stored in said carrier storage portion of the memory cell transistors associated with the remaining program lines so that an erase operation is performed selectively in said memory cell transistors.

2. An electrically erasable non-volatile semiconductor memory according to claim 1, wherein the gate of said switching transistor is applied with a third voltage which has a same polarity as the polarity of said first voltage during the erase operation, to weaken an electric field created in said switching transistor.

3. An electrically erasable non-volatile semiconductor memory according to claim 2, wherein the first, second and third voltages have a positive potential.

4. An electrically erasable non-volatile semiconductor memory according to claim 3, wherein the second and third voltages are equal to or lower than said first voltage.

5. An electrically erasable non-volatile semiconductor memory according to claim 4, wherein said first voltage is higher than a power supply voltage.

6. An electrically erasable non-volatile semiconductor memory, comprising:

data transfer lines on a semiconductor substrate being applied with a first voltage of a preselected potential, program lines insulatively crossing said data transfer lines on the substrate to provide crossing points therebetween;

a plurality of cell units associated with said data transfer lines and said program lines, each of said cell units having a plurality of memory cell transistors arranged at said crossing points, each of said transistors having a carrier storage layer and a control gate at which a corresponding program line is connected to each transistor; and a switching transistor with an insulated gate provided in each cell unit, for selectively connecting said cell unit to a corresponding data transfer line; wherein a designated one of said program lines is caused to be at a second voltage essentially the same as the first voltage so as to prevent a moving of said carriers stored in said carrier storage portion of the memory cell transistors, while the remaining ones of said program lines are caused to be held at a preselected voltage potential which changes the amount of carriers stored in said carrier storage portion of the memory cell transistors associated with the remaining program lines so that an erase operation is performed selectively in said memory cell transistors.

7. An electrically erasable non-volatile semiconductor memory according to claim 6, wherein:

the gate of said switching transistor is applied with a third voltage which has a same polarity as the polarity of said first voltage during the erase operation, to weaken an electric field created in said switching transistor.

8. An electrically erasable non-volatile semiconductor memory according to claim 7, wherein the first, second and third voltages have a positive potential.

9. An electrically erasable non-volatile semiconductor memory according to claim 8, wherein the second and third voltages are equal to or lower than said first voltage.

10. An electrically erasable non-volatile semiconductor memory according to claim 9, wherein said first voltage is higher than a power supply voltage of said memory.

11. A semiconductor memory device, comprising:

a plurality of memory cells each having a control gate and a carrier storage layer;

a plurality of select lines each connected to control gates of a first preselected number of said memory cells;

an electrode provided in common for memory cells connected to each of at least two of said select lines;

means for specifying one of said select lines to specify erase memory cells among said memory cells in an erase mode;

means for applying a low-level voltage to remaining ones of said select lines, and for applying a low erase voltage to said electrode to specify erase memory cells among said memory cells in an erase mode;

a plurality of data transfer lines each coupled to a second preselected number of said memory cells:

first selection transistors being coupled between said data transfer lines and said second preselected number of said memory cells; and means for applying a high level voltage to gates of said first selection transistors during said erase mode;

wherein only memory cells coupled to said remaining ones of said select lines are erased by removing carriers from carrier storage layers of said memory cells.

12. A device as recited in claim 11, wherein said means for applying a high level voltage to gates of said first selection transistors produces a weakened electric field between said gates of said first selection transistors and said electrode during said erasing mode.

13. A device as recited in claim 11, wherein said means for applying applies a voltage higher than a power supply voltage of said device as said erase voltage.

14. A method of erasing a memory cell in a semiconductor memory device, said device having a plurality of memory cells each having a control gate and a carrier storage layer, a plurality of select lines each connected to control gates of a preselected number of said memory cells, and an electrode provided in common for memory cells connected to each of at least two of said select lines, a plurality of data transfer lines each coupled to a second preselected number of said memory cells, and first selection transistors being coupled between said data transfer lines and said second preselected number of memory cells, comprising the steps of:

selecting one of said select lines;

applying a low-level voltage to remaining ones of said select lines;

applying an erase voltage to said electrode;

removing carriers from carrier storage layers of memory cells connected to said remaining ones of said select lines; and applying a high level voltage to gates of said first selection transistors to produce a weakened field in said first selection transistors during an erasing mode.

15. A method of erasing as recited in claim 14, comprising:

applying a voltage higher than a power supply of said device as said erase voltage.

16. A device as recited in claim 11, comprising:

a plurality of source lines coupled to said second preselected number of said memory cells; and second selection transistors provided between said source lines and said second preselected number of said memory cells;

wherein said high level voltage is applied to gates of said second selection transistors during said erase mode.

17. A method of erasing as recited in claim 14, wherein said device further comprises a plurality of source lines coupled to said second preselected number of said memory cells, and second selection transistors provided between said source lines and said second preselected number of said memory cells, said method further comprising the step of:

applying a voltage to gates of said second selection transistors to produce a weakened electric field is said second selection transistors during an erase mode.

* * * * *

UNITED STATES PATENT AND TRADEMARK OFFICE
CERTIFICATE OF CORRECTION

PATENT NO. : 5,528,547
DATED : June 18, 1996
INVENTOR(S) : Aritome et al.

It is certified that error appears in the above-indentified patent and that said Letters Patent is hereby corrected as shown below:

In column 11, line 9 of Claim 11, change "erase" to --unerase--.

In column 11, line 12 of Claim 11, change "low" to --high--.

Signed and Sealed this

Nineteenth Day of November, 1996

Attest:

BRUCE LEHMAN

*Attesting Officer*  *Commissioner of Patents and Trademarks*